United States Patent
Nakano

(10) Patent No.: US 8,150,069 B2
(45) Date of Patent: Apr. 3, 2012

(54) SIGNAL PROCESSING APPARATUS, SIGNAL PROCESSING METHOD, AND SOUND FIELD CORRECTION SYSTEM

(75) Inventor: Kenji Nakano, Kanagawa (JP)

(73) Assignee: Sony Corporation, Tokyo (JP)

( * ) Notice: Subject to any disclaimer, the term of this patent is extended or adjusted under 35 U.S.C. 154(b) by 1000 days.

(21) Appl. No.: 11/729,210

(22) Filed: Mar. 28, 2007

(65) Prior Publication Data

US 2007/0230556 A1    Oct. 4, 2007

(30) Foreign Application Priority Data

Mar. 31, 2006    (JP) .................. 2006-097248

(51) Int. Cl.
*H03G 5/00* (2006.01)
(52) U.S. Cl. ......... 381/103; 375/230; 375/232; 375/350
(58) Field of Classification Search .................. 375/230, 375/232, 350; 381/103
See application file for complete search history.

(56) References Cited

U.S. PATENT DOCUMENTS

| | | | | |
|---|---|---|---|---|
| 4,628,530 A * | 12/1986 | Op De Beek et al. | ........ | 381/103 |
| 5,572,443 A * | 11/1996 | Emoto et al. | .................. | 702/103 |
| 6,405,227 B1 * | 6/2002 | Prakash | ........................ | 708/300 |
| 6,721,428 B1 * | 4/2004 | Allred et al. | .................. | 381/103 |
| 7,249,511 B2 * | 7/2007 | Higashihara | .................... | 73/579 |
| 7,664,279 B2 * | 2/2010 | Flynn et al. | .................... | 381/314 |
| 7,787,635 B2 * | 8/2010 | Higashihara et al. | ........... | 381/66 |
| 2004/0136548 A1 * | 7/2004 | Miller | ........................... | 381/103 |
| 2004/0146170 A1 | 7/2004 | Zint | | |
| 2006/0114979 A1 * | 6/2006 | Pedersen et al. | ............. | 375/229 |
| 2006/0153391 A1 | 7/2006 | Hooley et al. | | |
| 2006/0153404 A1 * | 7/2006 | Gardner | ........................ | 381/103 |
| 2007/0133823 A1 | 6/2007 | Nakano | | |
| 2008/0189065 A1 | 8/2008 | Asada et al. | | |

(Continued)

FOREIGN PATENT DOCUMENTS

EP    0119645 A    9/1984

(Continued)

OTHER PUBLICATIONS

Mueller, Swen et al.: "Transfer-Function Measurement with Sweeps," Journal of the Audio Engineering Society, Audio Engineering Society, Jun. 2001, pp. 443-471, vol. 49, No. 6, New York, New York.

(Continued)

*Primary Examiner* — Shuwang Liu
*Assistant Examiner* — Sung Ahn
(74) *Attorney, Agent, or Firm* — Wolf, Greenfield & Sacks, P.C.

(57) ABSTRACT

A signal processing apparatus includes at least one equalization section, each of the equalization section being capable of setting a center frequency, a gain value at the center frequency, and a Q value and allowing set frequency-amplitude characteristics to be applied to an input signal; and a computation section. The computation section performs a center frequency determination process for computing, for target characteristics of the equalization section, a difference from the target characteristics for each area divided by a frequency portion where the gain of the characteristics of the equalization section is small and a frequency portion where the gain of the characteristics of the equalization section is large, a gain value determination process for determining the gain value at the center frequency of the equalization section, and a Q value determination process for setting the determined center frequency and the determined gain value.

19 Claims, 7 Drawing Sheets

U.S. PATENT DOCUMENTS

2008/0260170 A1   10/2008   Nakano

FOREIGN PATENT DOCUMENTS

| | | |
|---|---|---|
| EP | 0898364 A2 | 2/1999 |
| EP | 1786241 | 5/2007 |
| JP | 58-202619 | 11/1983 |
| JP | 05-327656 A | 12/1993 |
| JP | 08-047079 | 2/1996 |
| JP | 08-248077 A | 9/1996 |
| JP | 08-292179 A | 11/1996 |
| JP | 11-112254 | 4/1999 |
| JP | 2000-097762 A | 4/2000 |
| JP | 2001-025100 A | 1/2001 |
| JP | 2001-212100 A | 8/2001 |
| JP | 2001-212101 A | 8/2001 |
| JP | 2001-217665 A | 8/2001 |
| JP | 2002-354599 A | 12/2002 |
| JP | 2004-007245 A | 1/2004 |
| JP | 2005-175562 A | 6/2005 |
| JP | 2006-005902 A | 1/2006 |
| WO | WO 2007/078254 | 7/2007 |

OTHER PUBLICATIONS

Small, Richard H.: "Measurement of Loudspeaker Amplitude Modulation Distorsion," 114th Convention of the Audio Engineering Society, Mar. 2003, pp. 1-8, Amsterdam, The Netherlands.

\* cited by examiner

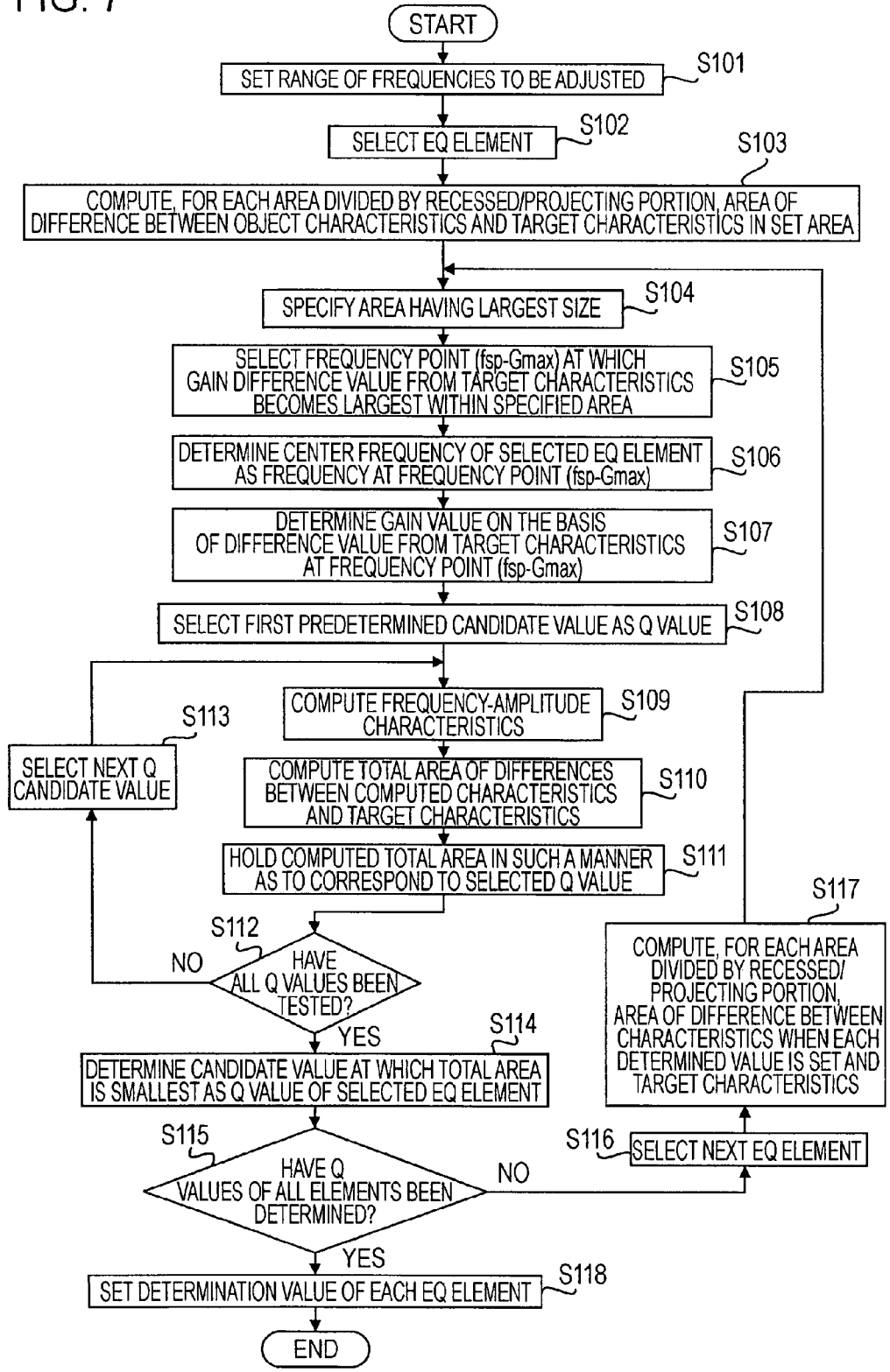

SIGNAL PROCESSING APPARATUS, SIGNAL PROCESSING METHOD, AND SOUND FIELD CORRECTION SYSTEM

CROSS REFERENCES TO RELATED APPLICATIONS

The present invention contains subject matter related to Japanese Patent Application JP 2006-097248 filed in the Japanese Patent Office on Mar. 31, 2006, the entire contents of which are incorporated herein by reference.

BACKGROUND OF THE INVENTION

1. Field of the Invention

The present invention relates to a signal processing apparatus that includes gain setting means capable of variably setting, in particular, a Q value and that is suitable for sound field correction and to a signal processing method for use with the signal processing apparatus. Also, the present invention relates to a sound field correction system for performing correction of, in particular, frequency-amplitude characteristics.

2. Description of the Related Art

As one effector for changing frequency-amplitude characteristics (hereinafter simply referred to as "frequency characteristics") of an audio signal, hitherto, a graphic equalizer (GEQ) is known. An example of a GEQ is one that is configured to include an operation element for instructing a gain at the center frequency of each frequency band for each equalizer element provided in such a manner as to correspond to each frequency band and that is configured to perform gain adjustment for each frequency band by a user manually operating the operation element.

As an equalizer element, furthermore, an equalizer element that is capable of variably setting the center frequency and the Q value (degree of sharpness) is also known as a so-called parametric equalizer (PEQ). That is, as a result of changing the center frequency and the Q value in the manner described above, the degree of sharpness of the shape of the frequency characteristics (gain window shape) and the position of the arrangement of the gain window in the direction of the frequency axis can be changed.

Here, whereas effectors for changing frequency-amplitude characteristics described above have become popular, in recent years, some car audio systems and AV (Audio Visual) systems for home use include an automatic sound field correction function for automatically performing various kinds of sound field correction by the system.

In such automatic sound field correction, for example, regarding frequency characteristics, a microphone is set in advance at a listening position, so that characteristics are measured on the basis of the result in which a test signal output from a speaker is detected by the microphone. Then, on the basis of the measurement result, signal processing is performed on an audio signal in such a manner that target frequency characteristics can be obtained. More specifically, the above-described equalizer is used to adjust the gain at each center frequency so that target frequency characteristics can be obtained.

As an example of the related art, Japanese Unexamined Patent Application Publication No. 1996-047079 can be cited.

SUMMARY OF THE INVENTION

When an equalizer is used to correct frequency characteristics, there are cases in which a sufficient number of equalizer elements are not provided due to, for example, the low-cost manufacture of a sound field correction system. When the number of equalizer elements is comparatively small, the above-described PEQ is sometimes used as each equalizer element. That is, even when the number of elements used in the manner described above is small and the range serving one element is large, according to a PEQ, since the center frequency, the gain at the center frequency, and the Q value can be changed in the manner described above, it is possible to correct frequency characteristics more flexibly.

However, regarding such a PEQ, the number of parameters that should be considered to obtain target characteristics is greater than that of a GEQ, and therefore, it is comparatively difficult to obtain desired frequency characteristics. Since the Q value can be set, in particular, in the PEQ, there are cases in which the gain window shape of each element has a large spread in the vicinity of the center frequency. Due to this, the gains set in the elements influence one another, and performing parameter setting in which this influence is taken into consideration becomes correspondingly difficult.

An automatic sound field correction process for the above-described frequency-amplitude characteristics is performed on the basis of the result in which a test signal is output as described earlier. Due to this nature, the automatic sound field correction process is performed prior to, for example, a normal audio reproduction operation. Therefore, if the time necessary for the automatic sound field correction process becomes longer, the time a user has to wait becomes correspondingly longer, resulting in a system with poor usability.

By considering the above, even when sound field correction is performed using a PEQ in the manner described above, it is important that the correction time be made as short as possible and as a result, a useful system in which the user does not need to wait a long time be realized.

For this purpose, there has been a demand for a sound field correction process using a PEQ that is as simple and easy as possible and in which the processing time is short.

Accordingly, in view of the above problems, in the present invention, the signal processing apparatus is configured as described below.

According to an embodiment of the present invention, there is provided a signal processing apparatus including at least one equalizing means, each of the equalizing means being capable of setting a center frequency, a gain value at the center frequency, and a Q value and allowing set frequency-amplitude characteristics to be applied to an input signal; and computation means.

The computation means may perform a center frequency determination process for computing a difference from target characteristics for each area divided by a frequency portion where the gain of the characteristics of the equalizing means is small with respect to the target characteristics of the equalizing means and a frequency portion where the gain of the characteristics of the equalizing means is large with respect to the target characteristics of the equalizing means, for specifying an area in which the difference is largest, and for determining the center frequency of one equalizing means among the at least one equalizing means on the basis of the frequency at which the gain difference from the target characteristics is largest in the specified area, a gain value determination process for determining the gain value at the center frequency of the equalizing means in which the center frequency is determined on the basis of the gain difference from the target characteristics at the center frequency, and a Q value determination process for setting the determined center frequency and the determined gain value, for calculating a candidate value at which characteristics closest to the target characteristics are obtained on the basis of a result in which each of the frequency-amplitude characteristics obtained when each candidate value that is predetermined as a Q value is set is computed, and for determining the candidate value as the Q value of the equalizing means.

When the signal processing apparatus includes a plurality of equalizing means, the computation means may perform the center frequency determination process, the gain value determination process, and the Q value determination process for each equalizing means.

Alternatively, the computation means may be configured to sequentially perform the center frequency determination process, the gain value determination process, and the Q value determination process for the plurality of equalizing means, and may be configured so as not to perform each of the determination processes for the equalizing means that has not determined each value when the gain difference between the frequency-amplitude characteristics by the equalizing means in which the center frequency, the gain value, and the Q value have been determined and the target characteristics becomes smaller than a predetermined value.

According to another embodiment of the present invention, there is provided a signal processing apparatus including a plurality of equalizing means, each of the equalizing means being capable of setting a gain value at a fixed center frequency, and a Q value and allowing set frequency-amplitude characteristics to be applied to an input signal; and computation means.

The computation means may perform, for each of the equalizing means, a frequency point selection process for computing a difference from target characteristics for each area divided by a frequency portion where the gain of the characteristics of the equalizing means is small with respect to the target characteristics of the equalizing means and a frequency portion where the gain of the characteristics of the equalizing means is large with respect to the target characteristics of the equalizing means, for specifying an area in which the difference is largest, and for selecting a frequency point at which the gain difference from the target characteristics is largest in the specified area, an equalizing means selection process for selecting the equalizing means at the center frequency corresponding to the frequency point selected in the frequency point selection process from among the plurality of equalizing means, a gain value determination process for determining the gain value at the center frequency of the equalizing means selected in the equalizing means selection process on the basis of the gain difference from the target characteristics at the center frequency, and a Q value determination process for setting the determined center frequency and the determined gain value, for calculating a candidate value at which characteristics closest to the target characteristics are obtained on the basis of a result in which each of the frequency-amplitude characteristics obtained when each candidate value that is predetermined as a Q value is set is computed, and for determining the candidate value as the Q value of the equalizing means.

According to an embodiment of the present invention, frequency characteristics are adjusted so that the characteristics approach target characteristics while each candidate value of Q is sequentially tested for each equalizing means starting from a portion where the difference from target characteristics is large. According to this, even when frequency characteristics influence one another among the elements according to the set value of Q, it is possible to appropriately perform correction so that the characteristics approach target characteristics. That is, as a result, even when an equalizer element capable of changing at least the gain value at the center frequency and the Q value is used as an effector for correcting frequency characteristics, it is possible to appropriately adjust the gain value and the Q value of each element so that the characteristics match the target characteristics.

Since, as described above, correction is performed sequentially starting from a portion where the difference from target characteristics is large, the correction in this case is performed by targeting from a macro portion to a micro portion in sequence. More specifically, first, a portion in which correction is most necessary is adjusted with priority by determining (setting) the Q value with priority by the first equalizing means. Thereafter, the Q value is determined with priority similarly for a portion in which correction is second most necessary, thereby performing correction. As a result of adopting such a technique, even when the number of equalizing means used is small, correction can be efficiently performed so that the characteristics match the target characteristics by placing importance on the correction efficiency of each equalizing means.

Furthermore, the correction process can be realized by only repeating a comparatively simple and easy computation process, such as computation of a gain difference for each area, computation of a difference from the target characteristics at the selected frequency point, and computation of characteristics when each Q candidate value is set. That is, according to such an embodiment of the present invention, processing that should be performed for correction can be made comparatively simple and easy, and as a result, the time necessary for the correction process can be shortened effectively.

As described above, according to an embodiment of the present invention, it is possible to realize a sound field correction system in which, even when equalizing means capable of changing at least the gain value of the center frequency and the Q value as an effector for correcting frequency characteristics is used, it is possible to appropriately adjust the gain value and the Q value of each equalizing means so that the characteristics match the target characteristics and even when the number of equalizing means used is small, correction can be appropriately performed so that the characteristics match the target characteristics.

Furthermore, according to an embodiment of the present invention, a correction process can be performed by repeating a comparatively simple and easy computation process, and a comparatively short processing time is necessary. As a result, it is possible to realize a useful system in which the time necessary for a correction process is short.

BRIEF DESCRIPTION OF THE DRAWINGS

FIG. 7 is a flowchart showing a processing operation to be performed to realize the operation according to the embodiment of the present invention.

DESCRIPTION OF THE PREFERRED EMBODIMENTS

Embodiments of the present invention will be described below.

Figure 1:
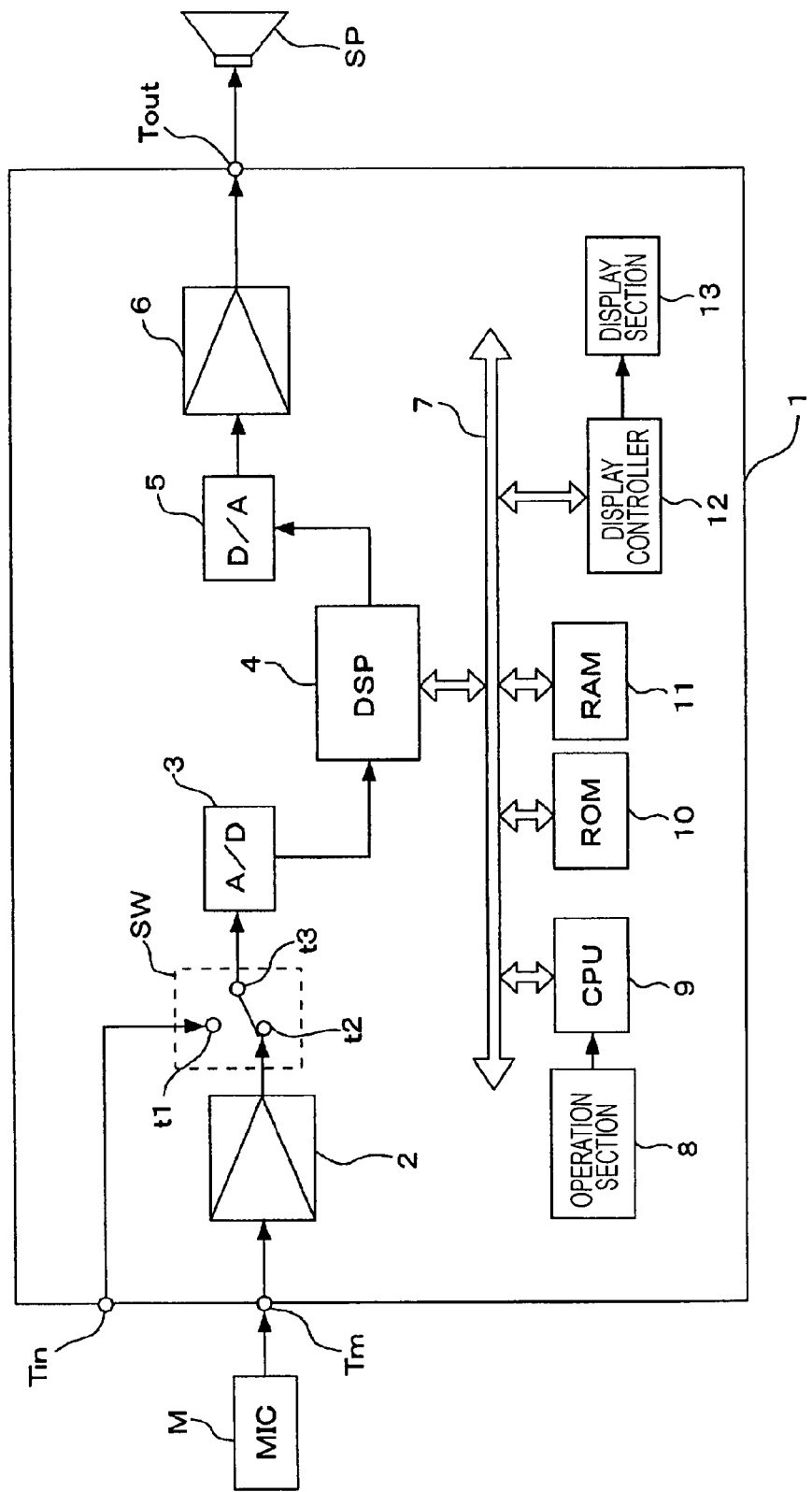
FIG. 1 is a block diagram showing the internal configuration of an AV amplifier including a signal processing apparatus according to an embodiment of the present invention.

FIG. 1 shows the internal configuration of an AV (Audio Visual) amplifier 1 configured to include a signal processing apparatus according to an embodiment of the present invention.

The AV amplifier 1 according to the embodiment of the present invention is configured to have an automatic sound field correction function for automatically performing various kinds of sound field correction, such as correction of frequency characteristics, on the apparatus side.

Figure 2:
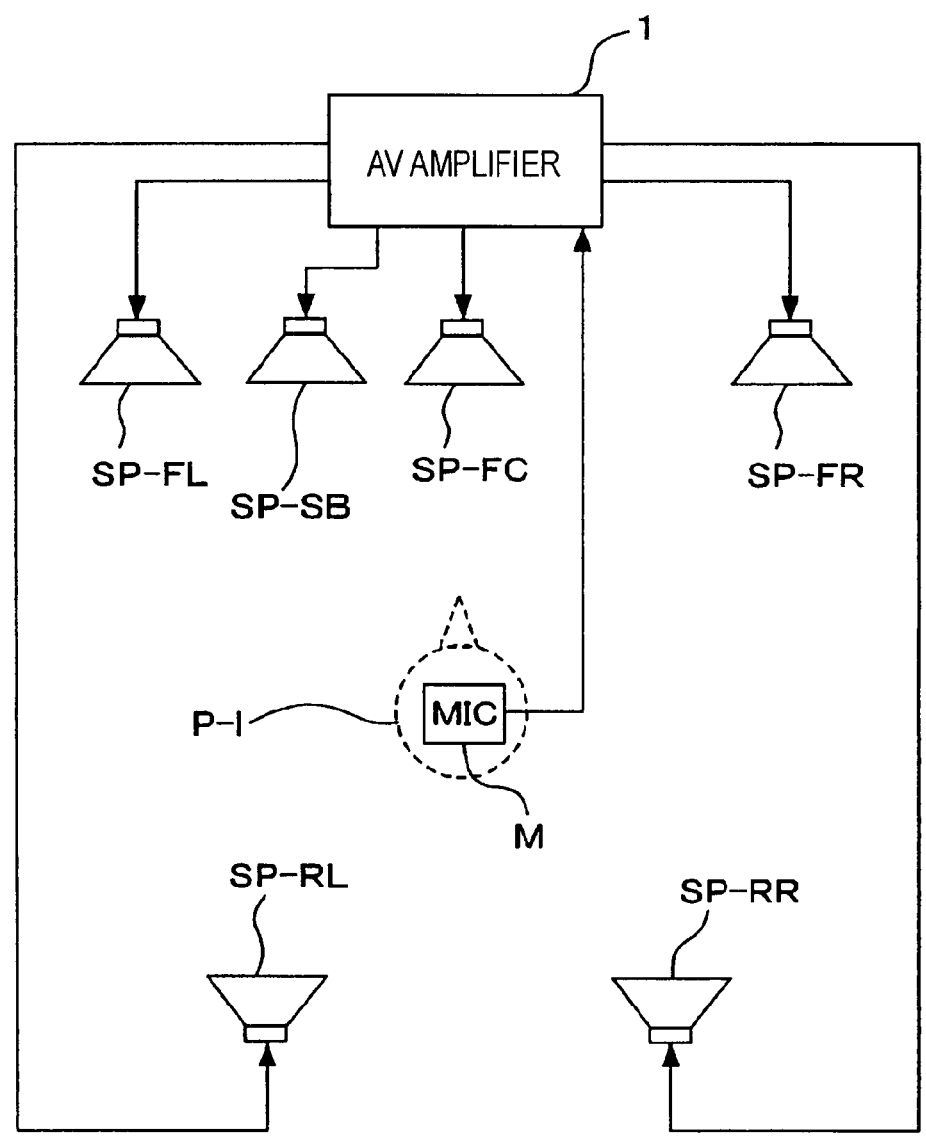
FIG. 2 shows the configuration of an AV system in which a speaker and a microphone are combined to the AV amplifier according to the embodiment of the present invention.

The outline of an AV system, including the AV amplifier 1, for implementing such an automatic sound field correction function, is shown in FIG. 2. FIG. 2 shows an example in which an AV system is constituted by a 5.1 ch surround system. As shown in FIG. 2, a total of six speakers, that is, 5-ch speakers of a front center speaker SP-FC, a front right speaker SP-FR, a front left speaker SP-FL, a back right speaker SP-RR, and a back left speaker SP-RL; and a subwoofer SP-SB, are connected to the AV amplifier 1.

Furthermore, a microphone M necessary for measuring acoustical characteristics is set at a listening position P-1, and this microphone is connected to the AV amplifier 1.

The description returns to FIG. 1.

In FIG. 1, the total of six speakers SP (SP-FC, SP-FR, SP-FL, SP-RR, SP-RL, and SP-SB) shown in FIG. 2 are shown as one speaker SP for the sake of description.

The speaker SP is connected to an audio output terminal Tout in the AV amplifier 1, as shown in FIG. 1. The microphone M shown in FIG. 2 is connected to a microphone input terminal Tm.

Furthermore, in addition to the microphone input terminal Tm, an audio input terminal Tin shown in FIG. 1 is provided in the AV amplifier 1, so that an audio signal can be input from the outside.

A switch SW is provided to switch input audio. The switch SW is configured to perform switching such that a terminal t1 or a terminal t2 is connected to a terminal t3 shown in FIG. 1. The audio input terminal Tin is connected to the terminal t1, and the microphone input terminal Tm is connected to the terminal t2 via a microphone amplifier 2. Furthermore, an A/D converter 3 is connected to the terminal t3.

That is, by selecting the terminal t1, audio input from the outside via the audio input terminal Tin can be performed, and by selecting the terminal t2, audio input from the microphone M via the microphone input terminal Tm can be performed.

Although not shown in FIG. 1, control for switching the switch SW is performed by a CPU 9 (to be described later) in such a way that audio is input from the microphone M when acoustical characteristics are measured (in this case, in particular, frequency characteristics are measured).

An audio signal converted into a digital signal by an A/D converter 3 is input to a DSP (Digital Signal Processor) 4. The DSP 4 performs various kinds of audio signal processing on the input audio signal. For example, for audio signal processing, processing for providing various kinds of acoustical effects, such as reverberation effects, is performed.

Furthermore, in the DSP 4 in this case, various kinds of acoustical characteristics necessary for automatic sound field correction, such as frequency characteristics and a delay time between each speaker SP and the microphone M, are measured. Such measurements of acoustical characteristics are performed on the basis of a result in which a test signal, such as a TSP (Time-Stretched Pulse) signal, is output from the speaker SP, and a detection signal that is obtained in response to the signal by the microphone M is analyzed.

The technology for measuring the above-described various kinds of acoustical characteristics (in particular, frequency characteristics) on the basis of a detection signal from the microphone M are well known, and accordingly, a detailed description thereof is omitted herein.

Furthermore, in particular, the DSP 4 in this case is configured to be capable of adjusting the gain of an input signal for each of a plurality of frequency bands as a so-called equalizer function. Here, the equalizer function of the DSP 4 is implemented by a digital filter called an MPF (Mid-Presence Filter). In this case, a software process of the DSP 4 allows functions as each equalizer element (hereinafter also referred to as an "EQ element") to be implemented.

Figure 3:
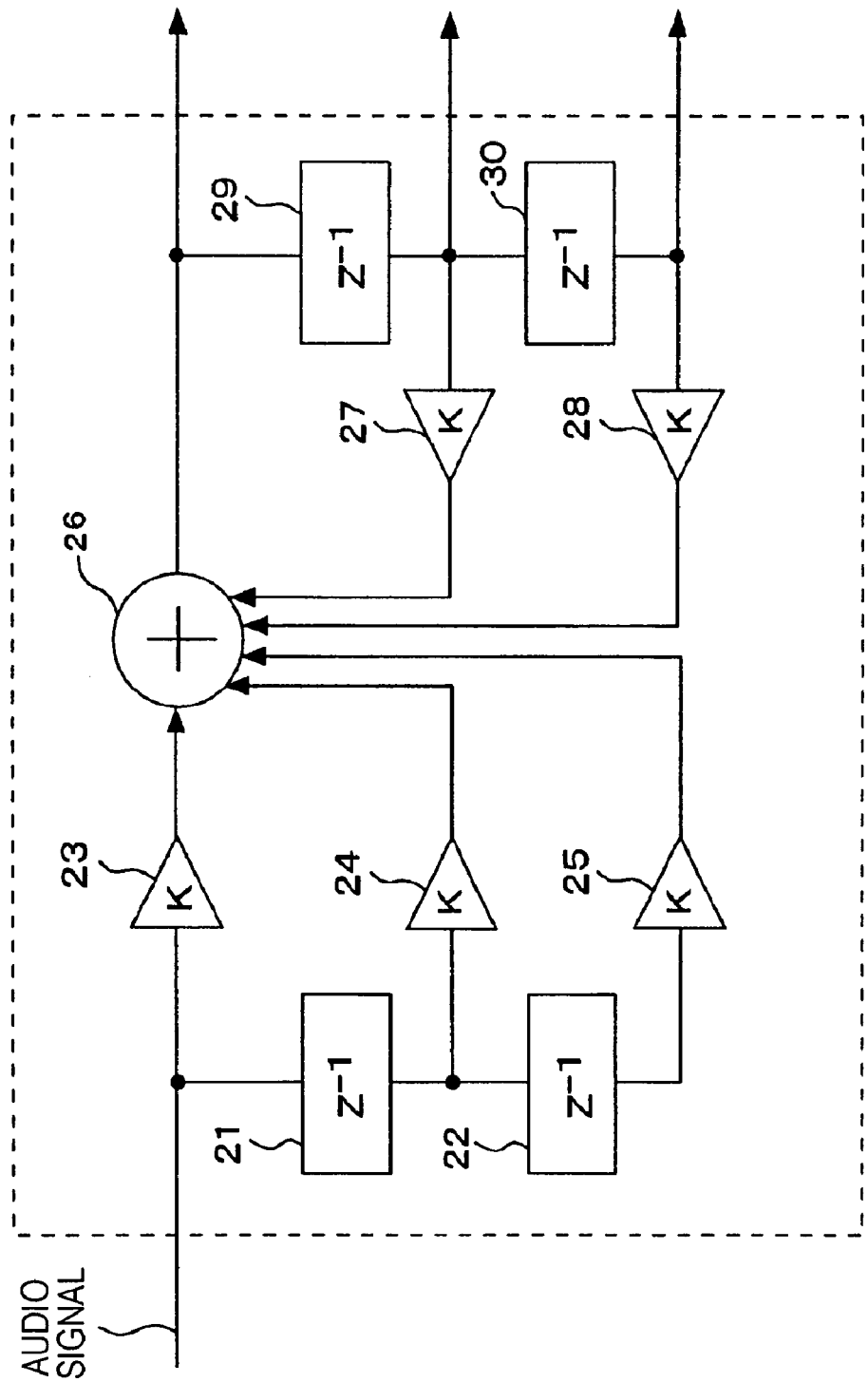
FIG. 3 is a block diagram showing an example of the configuration of an equalizer element provided in the signal processing apparatus according to the embodiment of the present invention.

FIG. 3 shows that component elements of an equalizer element implemented by an MPF are divided into function blocks.

As shown in an example of FIG. 3, as component elements of the MPF, delay elements 21, 22, 29, and 30, multipliers 23, 24, 25, 27, and 28, and an adder 26 can be cited.

As shown in FIG. 3, an audio signal is input to the adder 26 via the multiplier 23 and is also input to the adder 26 via the delay element 21 and the multiplier 24. Furthermore, the audio signal via the delay element 21 is also input to the adder 26 via the delay element 22→the multiplier 25.

The output of the addition by the adder 26 is output externally as shown in FIG. 3 and also, is made to branch and is input to the adder 26 via the delay element 29→the multiplier 27. The audio signal via the delay element 29 is input to the adder 26 via the delay element 30→the multiplier 28.

A description will be given for the sake of confirmation. The MPF shown in FIG. 3 has the charge of one equalizer element. For example, in the case of a 6-band equalizer, MPXs for six stages are arranged in a cascaded configuration. In this case, the delay element 21 and the delay element 22 are shared by the delay element 29 and the delay element 30 in the subsequent MPF. That is, the outputs of the delay element 21 and the delay element 22 are input to the adder 26 in the subsequent MPF via the multiplier 24 and the multiplier 25 in the subsequent MPF. Furthermore, the output of the multiplier 23 is also input to the adder 26 in the subsequent MPF.

In such an MPF, a multiplication coefficient can be variably set for each of the multipliers 23, 24, 25, 27, and 28. By using the value of the coefficient given to each multiplier in this manner, the center frequency, the gain value at the center frequency, and Q value can be set. That is, as a result, a function of a so-called parametric equalizer (PEQ) capable of variably setting the center frequency, the gain value at the center frequency, and the Q value is implemented.

In the DSP 4, a digital filter process such as that of an MPF is implemented by performing numerical value calculations in accordance with a program. The filter configuration of such an MPF is also known as a so-called biquad filter configuration.

In FIG. 1, an audio signal on which an audio signal process has been performed by the DSP 4 is converted into an analog signal by the D/A converter 5 and thereafter, is amplified by an amplifier 6 and supplied to an audio output end Tout.

Furthermore, in FIG. 1, the CPU (Central Processing Unit) 9 includes a ROM (Read Only Memory) 10 and a RAM (Random Access Memory) 11, and controls the entirety of the AV amplifier 1.

The CPU 9 controls each section by performing communication via a bus 7. As shown in FIG. 1, the ROM 10, the RAM 11, the display controller 12, and the DSP 4 are connected to the CPU 9 via the bus 7.

In the ROM 10 provided for the CPU 9, operation programs for the CPU 9, various kinds of coefficients, and the like are stored. In particular, in the case of this embodiment, in the ROM 10, a program (not shown) according to an embodiment (to be described later) of the present invention for the CPU 9 to execute a processing operation, is also stored. Furthermore, the RAM 11 is used as a work area for the CPU 9.

Furthermore, an operation section 8 is connected to the CPU 9.

The operation section 8 is provided with various kinds of operation elements provided in such a manner as to be arranged outside the housing of the AV amplifier 1 and supplies a command signal corresponding to each of operations to the CPU 9. The CPU 9 performs various kinds of control operations corresponding to the command signal from the operation section 8. As a result, in the AV amplifier 1, an operation in response to an input of the operation by the user is performed.

Furthermore, the operation section 8 may include a command receiving section for receiving a command signal, for example, in the form of an infrared signal transmitted from a remote commander. That is, the command receiving section is configured to receive a command signal transmitted in response to an operation from the remote commander and to supply the command signal to the CPU 9.

In this case, as an operation element provided in the operation section 8, an operation element for adjusting parameters for each equalizer element by the DSP 4 can be cited.

It is possible for the user to instruct and input parameters (the center frequency, the gain value at the center frequency, and the Q value) to be set for each EQ element by using the operation element. Since the CPU 9 provides a coefficient corresponding to the input value to the DSP 4, frequency characteristics (gain window shape) corresponding to the instructed input values are set in the corresponding equalizer element.

Furthermore, by performing instructions for the display controller 12, the CPU 9 also controls the display content of a display section 13. The display section 13 is a display device formed of, for example, an LCD (Liquid Crystal Display) device, and the display controller 12 drives and controls the display section 13 on the basis of instructions from the CPU 9. As a result, on the display section 13, a screen corresponding to the instructions from the CPU 9 is displayed.

Here, the AV amplifier 1 shown in FIG. 1 according to the embodiment is also provided with a function for automatically correcting frequency characteristics. First, as a precondition, when correcting frequency characteristics in this manner, target frequency characteristics (also called target characteristics) are set in advance. In the following, as an example, it is assumed that the characteristics that are flat over the entire frequency band are set as the target characteristics.

Figure 4A:
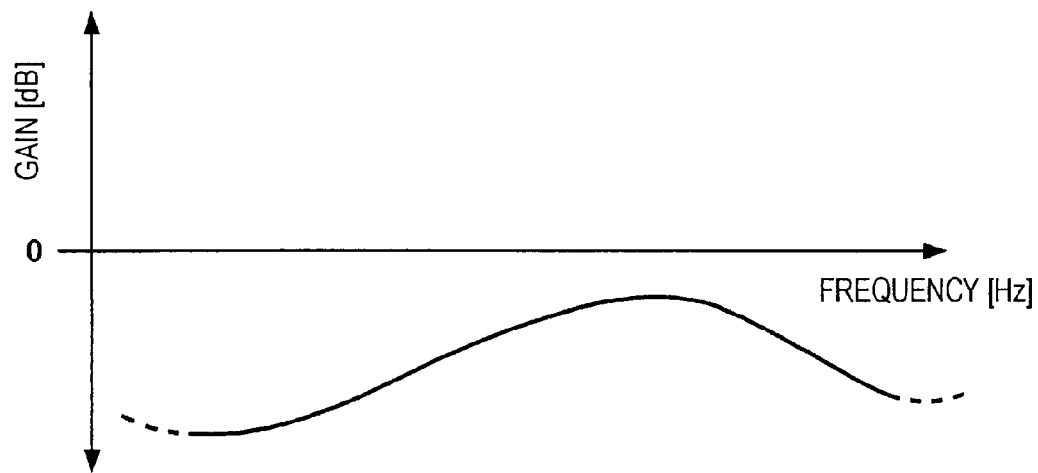
FIGS. 4A and 4B show the relationship between measured frequency characteristics and target characteristics.
Figure 4B:
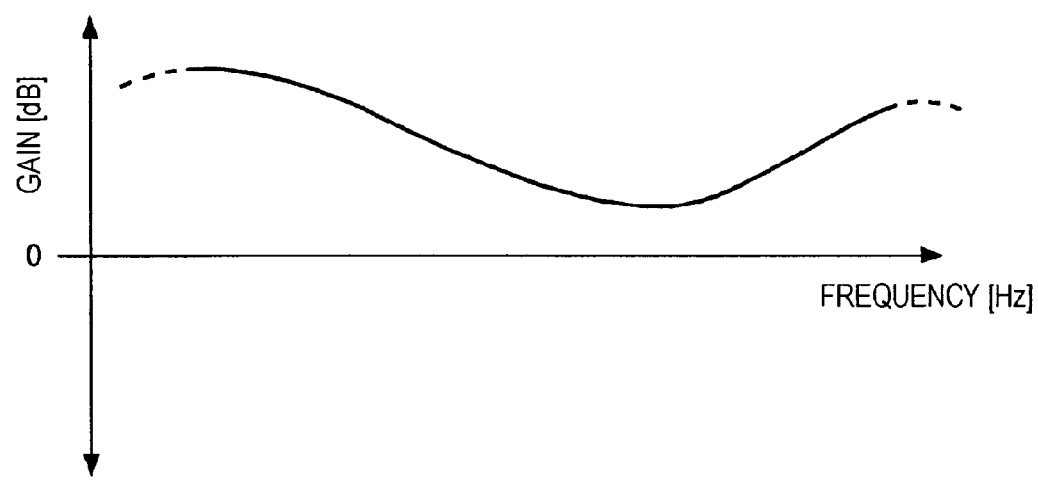

For example, when frequency characteristics shown in FIG. 4A are obtained, ideally, in order to make the frequency characteristics flat, frequency characteristics that cancel out the amplitude value of each band of FIG. 4A are set, as shown in FIG. 4B.

When such correction of frequency characteristics is to be performed, for the AV amplifier 1, there are cases in which a sufficient number of equalizer elements are not provided due to, for example, low-cost manufacture. For example, when the number of equalizer elements is comparatively small, as in this example, a PEQ is used as each equalizer element. That is, this is because, even when the number of elements used is small and the range serving one element is large, according to the PEQ, since the center frequency and Q (degree of sharpness) can be changed, it is possible to correct frequency characteristics more flexibly.

However, regarding such a PEQ, since the number of parameters that should be considered when obtaining target characteristics is greater than that of the graphic equalizer (GEQ), it is comparatively difficult to obtain desired characteristics. In particular, since the Q value can be set in the PEQ, the gain window shape of each element may have a large spread in the vicinity of the center frequency. Due to this, the frequency characteristics that are set among the elements may influence one another. Therefore, it is correspondingly difficult to perform parameter setting in which the above is considered.

Here, as is also described above, because an automatic sound field correction process for frequency characteristics is performed on the basis of a result in which a test signal is output, the automatic sound field correction process is performed, for example, prior to a normal audio reproduction operation. Therefore, if the time necessary for the automatic sound field correction process becomes longer, the time a user has to wait becomes correspondingly longer, resulting in a system with poor usability.

By considering the above, even when a sound field correction process is performed using a PEQ as in this example, it is important that the processing time be reduced as much as possible and as a result, a useful system in which the user does not need to wait a long time be realized.

For this purpose, there has been a demand for the sound field correction process using a PEQ that is as simple and easy as possible and that has a short processing time.

Accordingly, in this embodiment, as a technique for the sound field correction process when such a PEQ is used, the techniques described below are proposed.

FIGS. 5A and 5B and FIGS. 6A and 6B are illustrations of a technique of a sound field correction process according to this embodiment. FIGS. 5A to 6B show frequency characteristics Tks when the gain (dB) is plotted in the vertical axis and the frequency (Hz) is plotted in the horizontal axis.

Here, preconditions for performing a correction process of this example will be described.

First, it is assumed that the number of PEQ elements is 6. That is, six PEQ elements are cascaded, and frequency characteristics correction is performed as a whole. In this case, the six equalizer elements (EQ elements) are referred to as an EQ element-A, an EQ element-B, an EQ element-C, an EQ element-D, an EQ element-E, and an EQ element-F.

Furthermore, in this case, the range in which parameters such as the center frequency can be adjusted is set to a range of 10 octaves. Then, within the range of the 10 octaves, a predetermined frequency point is set (each ○ mark in the figures). The divided intervals of the frequency points are even at a width of ⅓ octaves. That is, in this case, a total of 30 frequency points are provided in the range in which adjustments are possible by the EQ elements.

In this case, each frequency point is also made to be a point at which each EQ element can set a center frequency. That is, in each EQ element, the frequency of one of the frequency points from among the frequency points at a division of ⅓ octaves can be selected and set as a center frequency.

For the sake of description, the frequency point to be set in this case is set so as to match a sampling point or an evaluation point regarding frequency characteristics in the DSP 4. That is, in the DSP 4 in this case, as data of the frequency characteristics Tsk, it is assumed that the gain value (amplitude value) for each frequency point in the figure is held.

In FIGS. 5A, 5B, 6A, and 6B, the characteristics Tsk are shown in the form of an analog waveform, and the data that is actually held is not shown.

Furthermore, in this case, in each EQ element, the upper limit of the gain value that can be set is assumed to be ±9 dB.

By considering the above precondition, a correction process according to this embodiment will be described below.

First, when performing a process for correcting frequency characteristics, as described with reference to FIG. 1, an operation for measuring frequency characteristics by means of the DSP 4 is performed.

Conceptually, it may be understood that a correction process is performed on the basis of a result in which the characteristics that are measured in this manner are compared with the target characteristics. However, in practice, the measured data itself may have fine irregularities due to the measurement environment, and there are cases in which, as it is, it is difficult to handle the measured data as data. Therefore, when correcting the frequency characteristics, the measured data on which a smoothing process has been performed is made to be corrected.

Also, in the embodiment, the characteristics in which correction is to be performed (hereinafter also referred to simply as "object characteristics") are made to be such that a smoothing process has been performed on measured data.

Figure 5A:
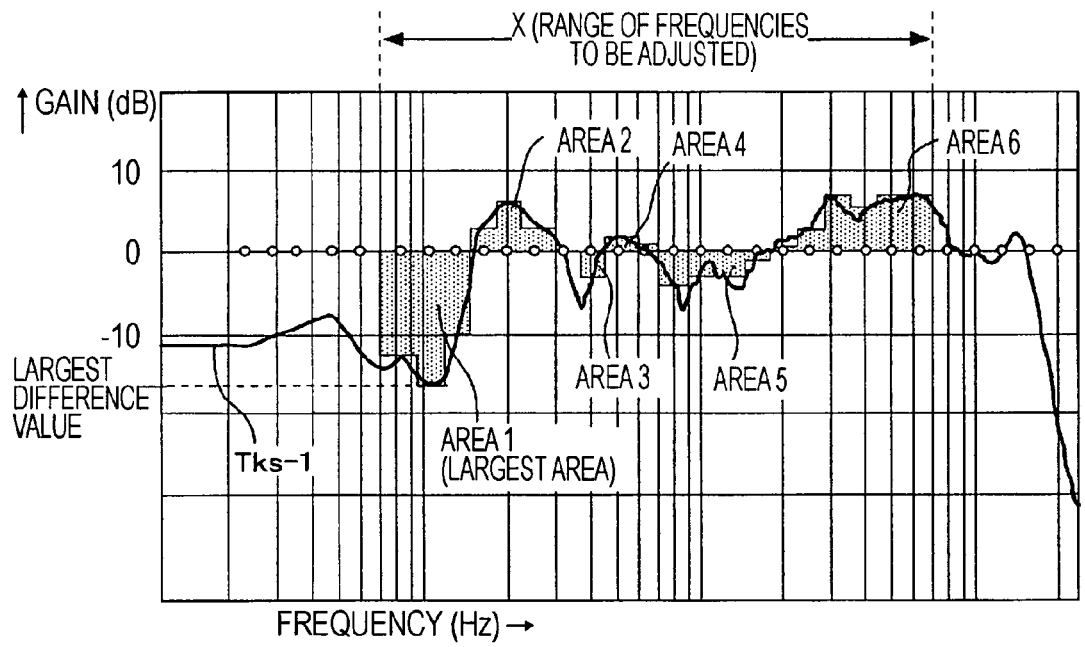
FIGS. 5A and 5B illustrate an operation according to an embodiment of the present invention.
Figure 5B:
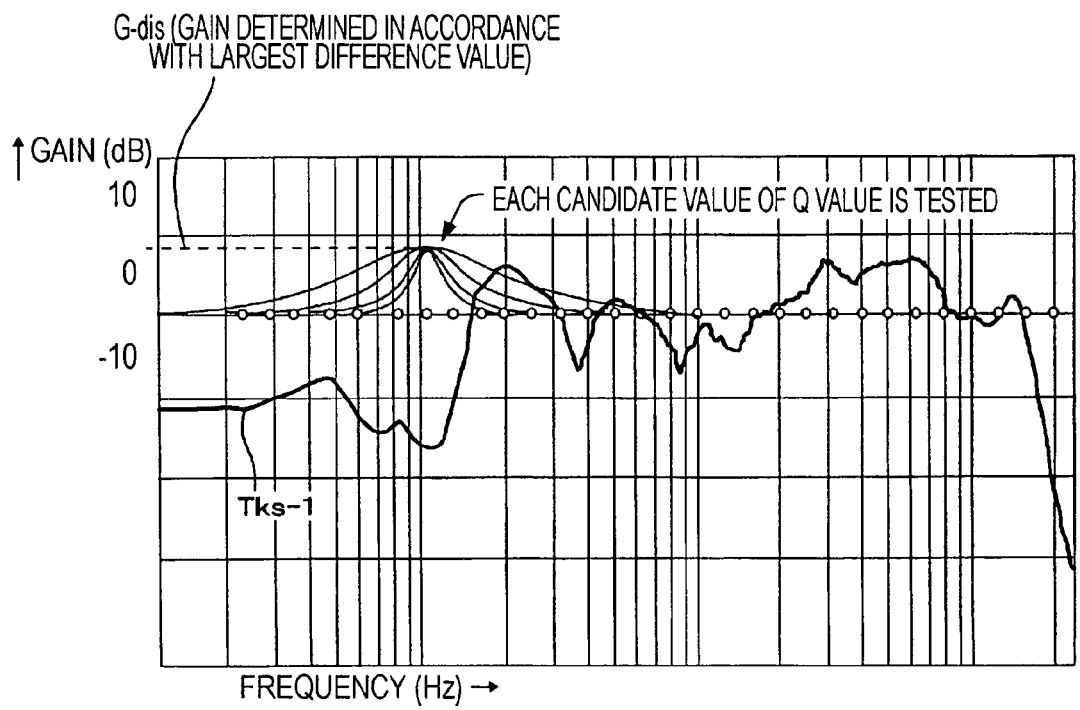

The frequency characteristics Tks-1 shown in FIGS. 5A and 5B indicate characteristics such that a smoothing process has been performed on measured characteristics.

The foregoing does not describe that, for the correction process as an embodiment, the characteristics after a smoothing process is performed need to be used as object characteristics. Depending on the case, measured data itself can be used as object characteristics. That is, object characteristics should preferably be characteristics based on a result in which frequency characteristics are measured.

That is, in summary, the characteristics of the equalizer element are adjusted so that the frequency characteristics as a result of adding correction characteristics by the equalizer element to the object characteristics match or approach the target characteristics.

After object characteristics of the frequency characteristics are obtained in this manner, in the correction process in this case, for setting a range X of frequencies to be adjusted shown in FIG. 5A, the range of frequencies in which adjustments for correction are performed is narrowed down.

Here, as characteristics of an ordinary speaker, it is known that it is difficult to output sound of a frequency band of an extremely low or high band. In such a case, even if gain adjustments are performed on the frequency bands, as long as it is difficult to output the sound from the speaker in the end, there is no meaning to perform a correction process. Furthermore, as is also described above, when it is considered that, preferably, the sound field correction process be completed as short a time period as possible, it is not preferable that a useless correction process is performed on the frequency bands and the necessary time period until the completion of the processing is prolonged.

By considering the foregoing, in this embodiment, after the range of frequencies in which gain adjustment is performed is narrowed down to the range X of frequencies to be adjusted, a correction process is performed.

For example, in this embodiment, in view of the relationship with the above-described speaker characteristics, the range in which adjustments should be performed in advance is set in advance. For example, as shown in FIG. 5A, in this case, the range of frequencies excluding the five frequency points in lower frequencies and the five frequency points in higher frequencies is assumed to be set in advance as the range X of frequencies to be adjusted.

In addition to being the range that is set in advance in this manner, the range X of frequencies to be adjusted can also be set on the basis of frequency characteristics that are actually measured.

Then, when the range X of frequencies to be adjusted is narrowed down in this manner, as shown as areas 1 to 6 in FIG. 5A, in this case, the amount of the gain difference from the target characteristics is computed for each area divided by a portion in which the gain (amplitude) of object characteristics Tks-1 is insufficient and a portion in which the gain (amplitude) of object characteristics Tks-1 is excessive with respect to the target characteristics that are indicated by the line of 0 dB. In other words, the amounts of gain differences at each frequency point are arranged in the order of frequency. The area in which the amount of the gain difference becomes a minus value continuously one or more times is an "area in which the gain is insufficient", and the area in which the amount of the gain difference becomes a plus value continuously one or more times is an "area in which the gain is excessive".

In the following, a portion where the gain is insufficient from the target characteristics is also called a recessed portion, and a portion where the gain is excessive from the target characteristics is also called a projecting portion.

In this case, the amount of the gain difference for each area divided by a recessed portion/projecting portion is determined on the basis of the area of the difference portion between the object characteristics Tks-1 and the target characteristics, as shown in FIG. 5A. More specifically, in each of the areas 1 to 6, the gain difference (amplitude difference) between the target characteristics and the object characteristics Tks-1 at each frequency point is determined.

In this case, since the intervals of the frequency points are set at a fixed width (band width of ⅓ octaves), a fixed value as the value of the width of the frequency points is multiplied by the value of the gain difference determined at each of the frequency points, and a value such that they are added together is computed as the area for each area indicated by a tinted portion in FIG. 5A.

Here, a case has been described in which the value of a frequency width that is a fixed value is multiplied by the gain difference between the object characteristics Tks-1 and the target characteristics at each frequency point in order to determine the area portion in the form of a bar graph, and the size of each area is determined by adding together the values. For example, when the size of each area is to be determined with higher accuracy, by performing an interpolation process in which the value of the gain difference at the adjacent frequency point is considered, the area can be determined on the basis of a shape closer to the shape of the difference portion between the actual target characteristics and the object characteristics.

Alternatively, in particular, when the intervals of the frequency points are fixed as in this example, the amount of the gain difference of each area can also be determined by simply adding together the gain difference at each frequency point for each area without forcibly determining the size of the area.

When the area of the difference from the target characteristics is computed for each area divided by the recessed/projecting portion, an area in which the area is largest among the areas is specified. In the example of FIG. 5A, a case in which the area 1 has the largest size is shown.

A description will be given for the sake of confirmation. As described above, the area in which the difference area (the amount of the gain difference) from the target characteristics is largest is an area that needs to be corrected most.

Then, when the area in which the difference area is largest is specified, the frequency point at which the gain difference from the target characteristics is largest is selected.

That is, in this case, in the area 1 having the largest size, as the frequency point at which the gain difference from the target characteristics is largest, a frequency point having the gain difference indicated as a "largest difference value" in FIG. 5A is selected.

When the frequency point at which the gain difference from the target characteristics in the area in which the difference area is largest is selected, in this case, the value of the center frequency of one EQ element selected from among the six provided EQ elements (the EQ element-A to the EQ element-F) is determined on the basis of the frequency at the selected frequency point having the largest gain difference.

In this case, as described earlier, in each EQ element, a center frequency is selected and set from among the frequency points that are set in advance. That is, in this case, the frequency point at which the gain difference is largest typically matches the frequency point at which each EQ element can set the center frequency. Therefore, the frequency at the specified frequency point at which the gain difference is largest is directly determined as the center frequency of the selected EQ element.

Here, first, the center frequency of the EQ element-A is assumed to be determined as the frequency at the selected frequency point at which the gain difference is largest.

The gain value at the center frequency of the selected EQ element is determined as a value based on the gain difference between the object characteristics Tks-1 and the target characteristics at the selected frequency point.

More specifically, in order to cancel out the gain difference from the target characteristics, in principle, the inversion value of the gain difference at the selected frequency point at which the gain difference is largest is determined as the gain value at the center frequency of the selected EQ element.

For example, in this case, if the gain value of the object characteristics Tks-1 indicated as the above-described "largest difference value" is −15 dB and the gain difference from the target characteristics is −15 dB-0 dB=−15, in principle, "+15", which is the inversion value of "−15" of the value of the gain difference is determined as the gain value of the selected EQ element-A.

However, in this case, as is also described above, the range in which the gain value can be set is ±9 dB. When the gain value to be determined in this manner actually exceeds the range of the gain value that can be set in the EQ element, a largest gain value within the settable range is determined. More specifically, as indicated by a gain G-dis in FIG. 5B, for example, +9 dB is determined as a gain value based on the largest difference value in this case.

A description will be given for the sake of confirmation. Even when the largest gain value is determined within the range that can be set in this manner, the gain value is nevertheless determined as a value based on the gain difference between the object characteristics Tks-1 and the target characteristics.

If the gain value of the selected EQ element is determined as the value based on the gain difference from the target characteristics in the manner described above, it is possible to determine the gain value in such a manner as to cancel out the gain difference from the target characteristics.

As described above, first, the center frequency and the gain value of the first EQ element selected from among a plurality of EQ elements are determined.

After that, in this case, furthermore, the Q value of the EQ element as a PEQ is determined.

For this purpose, first, as shown in FIG. 5B, each of the candidate values of the Q value is tested. That is, the determined center frequency and the determined gain value are set, frequency characteristics obtained when each candidate value of Q that is determined in advance is set are computed, and a Q value at which characteristics closest to the target characteristics are obtained as a result is determined.

Figure 6A:
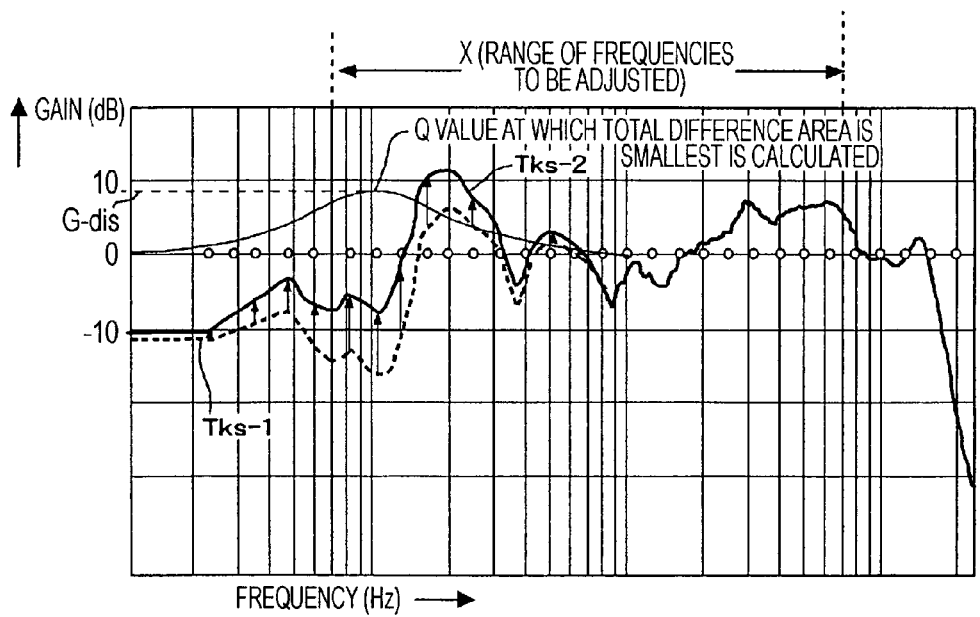
FIGS. 6A and 6B illustrate an operation according to an embodiment of the present invention.

More specifically, as the Q value at which characteristics closest to the target characteristics are obtained, as shown in FIG. 6A, the Q value at which the total area of the differences between the computed characteristics and the target characteristics is smallest is calculated.

That is, in this case, regarding the selected EQ element-A, the center frequency is set as the frequency of the selected frequency point, and the gain value is set at +9 dB. Then, frequency characteristics (characteristics such that EQ characteristics are applied to object characteristics) when each candidate value for the predetermined Q value is set are computed. At this time, for the EQ elements other than the selected EQ element, characteristics are computed by assuming that the gain value is set at 0 dB.

Then, for the computed characteristics, the total area of the differences from the target characteristics are computed in the range X of frequencies to be adjusted, and the candidate value of Q at which the computed total area value is smallest is computed.

A description will be given for the sake of confirmation. Also, in this case, the area of the difference from target characteristics should preferably be computed on the basis of the result in which the gain difference between the computed characteristics and the target characteristics is determined at each frequency point. Also, in this case, the area may not be used, and the sum of the gain differences at each frequency point can be simply handled as the value of the total area.

When the candidate value of Q at which the total area of the differences from the target characteristics is smallest and the characteristics closest to the target characteristics can be obtained is calculated, the candidate value is determined as the Q value of the selected EQ element.

FIG. 6A shows the gain window shape obtained by the selected EQ element (the EQ element-A) when the Q value at which the total area of the differences is smallest is set and the frequency characteristics Tks-2 (characteristics indicated by a solid line in the figure: computed characteristics) when the Q value is set. In FIG. 6A, the object characteristics Tks-1 are indicated by a broken line for the purpose of comparison with the computed characteristics Tks-2.

As a result of the operation up to this point, on the basis of the area in which the area of the differences (the amount of the gain difference) between the object characteristics Tks-1 and the target characteristics is largest, the parameters (the values of the center frequency, the gain value at the center frequency, and the Q value) that should be set for the first EQ element for the purpose of correction have been determined.

Then, when each value for correction for the first EQ element is determined in this manner, regarding the frequency characteristics (that is, in this case, the above-described computed characteristics Tks-2) obtained when each value determined for the EQ element is set, similarly, a process for specifying an area in which the amount of the gain difference from the target characteristics is largest is performed. Furthermore, a process for determining the center frequency that should be set in the next EQ element is performed on the basis of the frequency point at which the gain difference is largest. That is, the computed characteristics Tks-2 are handled similarly to the "object characteristics" in the previous step in which each value is determined for the first EQ element.

At this time, in this example, regarding the EQ element (the EQ element-A at this point) in which each value has already been determined, it is presumed that no further changes of the values are made. That is, regarding the EQ element in which each value has already been determined, new characteristics are computed by assuming that each of the determined values has been set.

Also, in this case, the amount of the gain difference is computed by targeting only the inside of the set range X of frequencies to be adjusted.

Figure 6B:
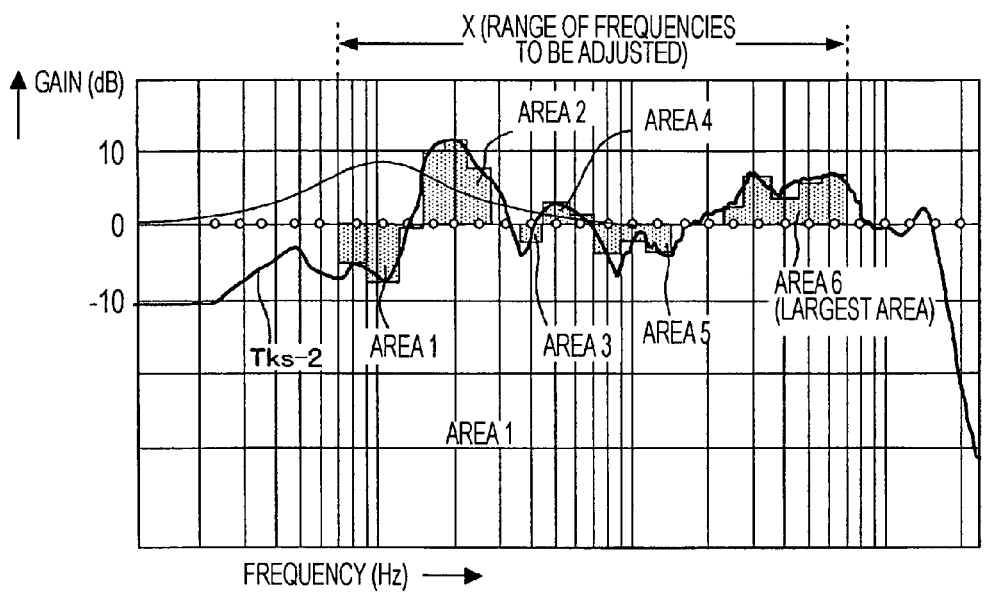

In this case, in FIG. 6B, a case in which an area having the largest difference area between the target characteristics and the computed characteristics Tks-2 (indicated by a solid line in FIG. 6B) is an area 6 is shown as an example. In response, the center frequency to be set in the next selected EQ element (the EQ element-B) is determined as the frequency at the frequency point at which the gain difference from the target characteristics is largest within the area 6.

Then, when the center frequency of the next EQ element is determined, the gain value and the Q value are determined by the same procedure as that in the previous case.

That is, the gain value is determined as a value based on the gain difference between the computed characteristics and the target characteristics at the selected frequency point at which the gain difference is largest. More specifically, the gain value is determined as the inversion value of the gain difference from the target characteristics (the gain value of the computed characteristics–the gain value of the target characteristics).

Then, for the Q value, a candidate value when characteristics closest to the target characteristics are obtained is determined on the basis of the result in which the determined center frequency and the determined gain value are set and the frequency characteristics obtained when each Q candidate value is set are computed.

A description will be given for the sake of confirmation. When frequency characteristics for determining the Q value in this case are to be computed, for the EQ element (the EQ element-A in this case) in which each value has already been determined, the overall characteristics are computed by assuming that each of the determined values has been set.

Also, thereafter, regarding the rest EQ elements, similarly, a process for specifying the largest area and a process for determining each value of the selected EQ element are sequentially performed on the basis of the frequency point at which the gain difference is largest within the largest area and the gain difference thereof.

That is, after the first EQ element (the EQ element-A in this case) is selected and each value is determined, regarding the second and subsequent EQ elements, the following processes are repeatedly performed.

For the EQ element in which each value has already been determined, regarding the frequency characteristics (the computed characteristics) obtained when each of the center frequency, the gain value at the center frequency, and the Q value, which are determined, is set, the area in which the difference area is largest is specified by computing the area of the difference from the target characteristics, and thereafter, the frequency point at which the gain difference from the target characteristics is largest in the area is selected.

On the basis of the frequency at the frequency point selected in this manner, at which the gain difference is largest, the center frequency of the selected EQ element is determined.

The gain value that should be set at the determined center frequency is determined as a value based on the gain difference between the computed characteristics and the target characteristics at the selected frequency point.

Furthermore, for the Q value of the selected EQ element, a candidate value when characteristics closest to the target characteristics are obtained is determined on the basis of the result in which the center frequency and the gain value that have been determined in the manner described above are set in the EQ element, and frequency-amplitude characteristics obtained when each predetermined candidate value is set (also, in this case, regarding the EQ element in which each value has already been determined, the overall characteristics are computed by assuming that each of the determined values has been set).

Then, when each value of all the EQ elements is determined as a result of the repeated processing, the determined values are set as the parameters of the corresponding EQ element. That is, a coefficient for indicating each determined value for each EQ element is provided to the DSP 4, and in response, the DSP 4 sets each of the provided coefficients as a coefficient for the multiplier (See FIG. 3) of the EQ element.

As described above, in the correction process according to this embodiment, the gain is adjusted so that the characteristics approach the target characteristics while each candidate value of Q is sequentially tested for each of the EQ elements in sequence starting from a portion where the difference from the target characteristics is large. Accordingly, also when the gains influence one another among the elements due to the set value of Q, it is possible to appropriately perform correction so that the characteristics approach the target characteristics.

That is, also when a PEQ is used as an effector for correcting frequency characteristics, it is possible to appropriately adjust parameters of each element so that the characteristics match the target characteristics.

As a result of performing correction in sequence starting from the portion where the difference from the target characteristics is large in the manner described above, the correction in this case is performed gradually by targeting from a macro portion to a micro portion. More specifically, first, the Q value is determined (set) with priority by the first EQ element so as to adjust the portion in which correction is most necessary with priority. Thereafter, for the portion in which correction is second most necessary, the Q value is similarly determined in sequence with priority in order to perform correction.

As a result of adopting such a technique, even when the number of EQ elements used is small, it is possible to efficiently perform correction so that the characteristics match the target characteristics by placing importance on the correction efficiency for each element.

Furthermore, the correction process according to this embodiment can be implemented by repeating comparatively simple and easy computations, such as at least the computation of the difference area for the purpose of specifying an area in which the amount of gain difference is largest, the computation of the gain value that should be set in the selected EQ element, the computation of the frequency characteristics when each Q candidate value is set, and the computation of the total area of the differences between each of the frequency characteristics and the target characteristics. Therefore, a comparatively short processing time is necessary. That is, according to this, even when a PEQ is used as an effector for correcting frequency characteristics, a comparatively short processing time is necessary to obtain the target characteristics, and the time the user has to wait can be shortened, making it possible to realize a useful system.

Next, a description will be given, with reference to the flowchart in FIG. 7, of the processing operation to be performed to implement a sound field correction process according to this embodiment described in the foregoing.

The processing operation shown in FIG. 7 is performed by the CPU 9 shown in FIG. 1 in accordance with a program stored in the ROM 10.

In FIG. 7, it is assumed that, on the basis of the instructions from the CPU 9, frequency characteristics have already been measured by the DSP 4 and that information on the object characteristics obtained on the basis of the measurement result has been supplied to the CPU 9.

In FIG. 7, initially, in step S101, the range of frequencies to be adjusted is set. That is, as described above with reference to FIGS. 5A and 5B, in this case, a range X of frequencies to be adjusted, which is determined in advance, is set.

In the subsequent step S102, an EQ element is selected. That is, in this case, a first EQ element (for example, the EQ element-A) is selected from among the six elements from the EQ element-A to the EQ element-F.

In step S103, in the set range, a process for computing the area of the difference between the object characteristics and the target characteristics for each area divided by a recessed/projecting portion is performed. That is, in the range X of frequencies to be adjusted, which is determined in advance, regarding the object characteristics based on the measurement result by the DSP 4, in this case, the area of the gain difference from the target characteristics is computed for each area divided by a portion in which the gain (amplitude) is insufficient and a portion in which the gain (amplitude) is excessive with respect to the target characteristics that are indicated by the line of 0 dB.

In step S104, on the basis of the computed result of step S103, an area having the largest size is specified.

In step S105, the frequency point (fsp-Gmax) at which the gain difference value from the target characteristics within the specified area is largest is selected.

After that, in step S106, the center frequency of the selected EQ element is determined as the frequency at the frequency point (fsp-Gmax).

In step S107, the gain value at the center frequency is determined on the basis of the difference value from the target characteristics at the frequency point (fsp-Gmax). That is, the inversion value of the difference value between the gain value of the object characteristics at the frequency point (fsp-Gmax) and the gain value of the target characteristics is determined as the gain value at the center frequency of the EQ element.

In step S108, a first predetermined candidate value is selected as the Q value. That is, a predetermined candidate value is selected as the first candidate value from among the preset candidate values of Q.

In the subsequent step S109, frequency characteristics are computed. That is, for the EQ element selected in step S102, the center frequency and the gain value that are determined in the steps S106 and S107 are set, respectively. Furthermore, as the Q value, frequency characteristics (characteristics such that EQ characteristics are applied to object characteristics) obtained when the candidate value selected in the previous step S108 (or step S113 (to be described later)) is set are computed.

In the subsequent step S110, the total area of the differences between the computed characteristics and the target characteristics is computed.

Furthermore, in the subsequent step S111, the computed total area and the selected Q value are stored in, for example, the RAM 11 in such a manner as to correspond to each other.

In step S112, a determination process is performed as to whether or not all the Q values have been tested. That is, with respect to all the Q values that have been set in advance, a determination process is performed to check whether or not the frequency characteristics are computed and the total area is computed when they are set.

When it is determined in step S112 that a negative result is obtained by determining that all the Q values have not yet been tested, the process proceeds to step S113, where the next Q candidate value is selected. Thereafter, the process returns to the previous step S109 for computing the frequency characteristics. That is, the steps S112→S113 constitute a routine for testing all the Q values.

On the other hand, when it is determined in step S112 that an affirmative result is obtained by determining that all the Q values have been tested, the process proceeds to step S114, where the value is determined to be the Q value of the EQ element at which a candidate value at which the total area is smallest is selected.

In the subsequent step S115, a determination process is performed to check as to whether or not the Q values of all the elements have been determined.

When a negative result is obtained by determining that the Q values of all the EQ elements have not yet been determined, the process proceeds to step S116, where the next EQ element is selected. That is, one EQ element is selected from other than the EQ elements in which the center frequency, the gain value, and the Q value have already been determined.

Then, in step S117, the area of the differences between the frequency characteristics (the computed characteristics) and the target characteristics when each of the determined values (the center frequency, the gain, and Q) is set is computed for each area divided by a recessed/projecting portion.

In this case, as a result of the previous process of step S109, the frequency characteristics when each determined value is reflected have been computed. Therefore, if the information is held, the difference area between the computed characteristics and the target characteristics should preferably be computed for each area divided by a recessed/projecting portion similarly to that in step S103.

When the computation process in step S110 is similarly configured to compute a difference area for each area of a recessed/projecting portion and the total area value is determined by adding the area value for each area, in step S117, there is no need to determine the area for each recessed/projecting portion once again, and the area value of each area can be obtained on the basis of the area information for each area that has already been computed in this manner.

When the above-described process of step S117 is performed, as shown in FIG. 7, the process returns to the previous step S104, where a process for specifying an area having the largest size is performed. That is, as a result, until each value is determined for all the EQ elements, processes are repeatedly performed for selecting an EQ element, for determining the center frequency and the gain value of the selected EQ element, and for determining the Q value after each Q candidate value is tested.

Then, when it is determined in the previous step S115 that an affirmative result is obtained by determining that the Q values of all the EQ elements have been determined, the process proceeds to step S118, where a process for setting the determined value of each EQ element is performed. That is, as described above, a coefficient for indicating each value for each determined EQ element is provided to the DSP 4. In the DSP 4, each of the provided coefficients is set as a coefficient for the multiplier (See FIG. 3) of each EQ element.

For example, in this embodiment, a case has been described as an example in which the CPU 9 performs a process for determining a parameter to be set in each EQ element for the purpose of a correction process. Alternatively, this process can also be performed by the DSP 4 alone. In this case, the DSP 4 may perform the processing operation shown in FIG. 7.

Furthermore, in the embodiment described with reference to FIG. 7, for example, it is determined whether the area of the difference between the characteristics computed in step S117 and the target characteristics is smaller than a predetermined value. When it is determined that the area of the difference is smaller than the predetermined value, the parameter setting process of step S118 may be performed even if the parameter determination process has not yet been completed for all the EQ elements.

Furthermore, in the embodiment, a case has been described, as an example, in which the process for determining each value for a correction process is completed in response to the fact that each value is determined for all the EQ elements in order to complete a cycle. Alternatively, such a process for determining each value in order to complete a cycle for all the EQ elements can be set as one set of a process so that this one set of a process is performed a predetermined number of times that is set in advance.

Alternatively, each time the above-described determination process for one set is performed, an evaluation is performed by comparing the characteristics when the determined value is set with the target characteristics, so that the determination process is completed in response to the fact that the characteristics have been improved by a predetermined amount or more. That is, for example, each time a determination process for one set is performed, the total area of the differences between the characteristics when the determined value is set for each element and the target characteristics is computed. In response to the fact that the value of the total area becomes smaller than or equal to a predetermined value, the determined value at the point is set in each element.

Furthermore, in the embodiment, for the sake of simplicity of description, a case has been described, as an example, in which the sampling point of the frequency characteristics matches the center frequency that can be selected by each EQ element. In addition, when they do not match (that is, it is difficult to select the center frequency from among the frequency points), the center frequency of the selected EQ element should preferably be determined as the center frequency closest to the frequency point at which, for example, the gain difference value is largest from among the selectable center frequencies.

Furthermore, in the embodiment, a case has been described, as an example, in which a correction process is performed by narrowing down a range of frequencies to be adjusted. Adjustments can also be performed without narrowing down a range of frequencies to be adjusted.

In the embodiment, the function of each equalizer element is implemented by a software process. Alternatively, each equalizer element can also be realized by hardware.

Furthermore, in the embodiment, as the target characteristics, characteristics that are flat over the entire band are set. In addition, any desired target characteristics can be set. For example, as the target characteristics, characteristics that are obtained by measuring frequency characteristics (for example, characteristics based on desired acoustical characteristics of a speaker) may be used, and characteristics that are set in response to an operation input may be used.

Furthermore, in the embodiment, a case has been described, as an example, in which a PEQ in which a center frequency, a gain value, and a Q value can be changed is used as each equalizer element. Alternatively, an element in which, for example, the center frequency is fixed and only the gain value at the center frequency and the Q value can be changed, can also be used.

When the center frequency can be changed as described in the foregoing embodiments, a process is necessary for determining the center frequency on the basis of the frequency point at which the gain difference from the target characteristics is largest within the area in which the amount of the gain difference (the difference area) from the target characteristics is largest. However, in this case, such a process for determining the center frequency is not necessary. That is, as processes in this case, the following processes should preferably be performed. An EQ element having a center frequency in the vicinity of a frequency point at which a gain difference is largest is selected. Thereafter, a gain value to be set at the fixed center frequency of the EQ element is similarly determined on the basis of the gain difference between the measured characteristics and the target characteristics at the frequency point at which the gain difference is largest. After that, the value is determined as the Q value of the EQ element at which a candidate value at which characteristics closest to target characteristics are obtained is selected on the basis of the frequency characteristics obtained when each Q candidate value is set under the setting of the gain value of the center frequency.

Then, for the second and subsequent EQ elements, the following processes are repeatedly performed.

Frequency characteristics when each of the determined values is set in the EQ element in which each value has already been determined are computed, and after an area in which the amount of the gain difference between the computed characteristics and the target characteristics is largest is specified, the frequency point at which the gain difference from the target characteristics is largest within the area is selected.

An EQ element in which the center frequency corresponding to the selected frequency point at which the gain difference is largest is selected from among the EQ elements in which each value has not been determined (in this case, when the frequency point that has already been selected has been determined as the center frequency of another element, for example, another EQ element in which the frequency of the frequency point at which the gain difference is second largest within the area is set as the center frequency is selected).

The gain value to be set at the center frequency of the selected EQ element is determined as a value based on the gain difference at the selected frequency point.

After that, for the Q value, a candidate value at which characteristics closest to the target characteristics are obtained is determined on the basis of the result in which each of the determined values is set in gain setting means in which each value has already been determined, the determined gain value is set as the gain value at the center frequency of the selected EQ element, and frequency characteristics obtained when each predetermined candidate value is set as the Q value are computed.

Also, as a result of a process corresponding to such a case in which the center frequency is fixed, basically, in the correction process, parameters are adjusted so that the characteristics approach the target characteristics while sequentially testing each candidate value of Q for each of the EQ elements starting from a portion where the difference from the target characteristics is large. That is, as a result, also in this case, correction can be appropriately performed so that the characteristics approach the target characteristics in response to a case in which the mutual frequency characteristics influence one another among the elements on the basis of the set value of Q.

Furthermore, also in this case, the correction process can be realized by repeating comparatively simple and easy computations, such as the computation of an area, and a useful system can be realized by decreasing the necessary processing time.

Furthermore, although description has been omitted in the embodiment, when the center frequency and the gain value of the second and subsequent EQ elements are to be determined, the following conditions can also be added such that "when the center frequency and the gain value becomes the same center frequency as the center frequency that has already been determined as the center frequency of another EQ element and a gain (having a different sign and having an equal absolute value) opposite to the gain value of the determined center frequency, the center frequency and the gain value are avoided". Such an addition of conditions allows a situation to be prevented in which, for example, interaction of the gain is repeated among a plurality of EQ elements.

It should be understood by those skilled in the art that various modifications, combinations, sub-combinations and alterations may occur depending on design requirements and other factors insofar as they are within the scope of the appended claims or the equivalents thereof.

What is claimed is:

1. A signal processing apparatus comprising:
at least one equalizing means, each of the equalizing means configured for setting a selected center frequency, a selected gain value at the selected center frequency, and a selected degree of sharpness (selected Q value) and modifying an input signal using the selected center frequency, the selected gain value, and the selected Q value; and
computation means, wherein the computation means performs automatically
an area identification process that identifies plural areas within a predetermined frequency range for which measured frequency-amplitude characteristics deviate from target characteristics,
an area selection process that selects a largest area from the plural areas for which an equalizing means has not been applied as a next area for applying the at least one equalizing means,
a center frequency determination process for identifying for each of the at least one equalizing means the selected center frequency from a finite set of predetermined frequencies based on a comparison of the measured or computed frequency-amplitude characteristics with the target characteristics,
a gain value determination process for identifying for each of the at least one equalizing means the selected gain value based on a difference between the measured or computed frequency-amplitude characteristics and the target characteristics at the selected center frequency, and
a Q value determination process for identifying for each of the at least one equalization means the selected Q value from a finite set of predetermined candidate Q values, the selected Q value identified based on a comparison of computed frequency-amplitude characteristics with the target characteristics.

2. The signal processing apparatus according to claim 1, wherein a plurality of equalizing means are provided for a plurality of portions of a frequency range, and
the computation means performs the center frequency determination process, the gain value determination process, and the Q value determination process for each of the equalizing means.

3. The signal processing apparatus according to claim 2, wherein the computation means further performs a setting process for setting a determined value for each equalizing means in response to the fact that each value is determined for all the equalizing means.

4. The signal processing apparatus according to claim 1, wherein a plurality of equalizing means are provided, and
the computation means sequentially performs the center frequency determination process, the gain value determination process, and the Q value determination process on the plurality of equalizing means, and does not perform each of the determination processes when the gain difference between the measured or computed frequency-amplitude characteristics and the target characteristics is smaller than a predetermined value.

5. The signal processing apparatus according to claim 4, wherein the computation means further performs a setting process for setting a determined value for the equalizing means in response to the fact that each value is determined for the equalizing means in which the selected center frequency, the selected gain value, and the selected Q value have been determined.

6. The signal processing apparatus according to claim 1, wherein the center frequency determination process identifies the selected center frequency on the basis of a maximum gain difference from the target characteristics nearest a predetermined frequency point.

7. The signal processing apparatus according to claim 6, wherein the gain value determination process identifies the selected gain value on the basis of the gain difference from the target characteristics at the predetermined frequency point.

8. The apparatus of claim 1, wherein the selected gain value for each of the at least one equalizing means is limited to a range of values between −9 dB and +9 dB.

9. The apparatus of claim 1, wherein the predetermined candidate Q values are limited to five values.

10. The apparatus of claim 1, wherein the selected center frequency for each of the at least one equalizing means is a predetermined value nearest a frequency point at which a gain difference from the target characteristics is largest in a specified area for each of the at least one equalizing means.

11. The apparatus of claim 1, wherein the limited set of predetermined frequencies comprises about 30 frequency values spaced by about ⅓ octave.

12. A signal processing method for use with a signal processing apparatus, the apparatus including computation means and at least one equalizing means, each of the equalizing means configured for automatically setting a selected center frequency, a selected gain value at the selected center frequency, and a selected degree of sharpness (selected Q value), the signal processing method comprising the acts of:
identifying plural areas within a predetermined frequency range for which measured frequency-amplitude characteristics deviate from target characteristics;
selecting a largest area from the plural areas for which an equalizing means has not been applied as a next area for applying the at least one equalizing means;

identifying for each of the at least one equalizing means the selected center frequency from a finite set of predetermined frequencies based on a comparison of the measured or computed frequency-amplitude characteristics with the target characteristics;

identifying for each of the at least one equalizing means the selected gain value based on a difference between the measured or computed frequency-amplitude characteristics and the target characteristics at the selected center frequency;

identifying for each of the at least one equalization means the selected Q value from a finite set of predetermined candidate Q values, the selected Q value identified based on a comparison of computed frequency-amplitude characteristics with the target characteristics, wherein the computed frequency-amplitude characteristics are obtained using the selected center frequency value and the selected gain value; and modifying an input signal using the selected center frequency, the selected gain value, and the selected Q value.

13. The signal processing method according to claim 12, wherein the acts of identifying the selected center frequency, identifying the selected gain value, and identifying the selected Q value for each of the at least one equalization means are carried out for a portion of a frequency range.

14. The signal processing method according to claim 12, further comprising the steps of sequentially performing the acts of identifying the selected center frequency, identifying the selected gain value, and identifying the selected Q value for each of the at least one equalization means, and not performing each of the acts of identifying when the gain difference between the measured or computed frequency-amplitude characteristics and the target characteristics is smaller than a predetermined value.

15. A sound field correction system comprising:
a speaker;
a microphone; and
a signal processing apparatus,
wherein the signal processing apparatus comprises
measurement means for measuring frequency-amplitude characteristics on the basis of a result in which a test signal output from the speaker is detected by the microphone,
at least one equalizing means, each of the equalizing means configured for setting a selected center frequency, a selected gain value at the selected center frequency, and a selected degree of sharpness (selected Q value) and modifying an input signal using the selected center frequency, the selected gain value, and the selected Q value, and
computation means, wherein the computation means performs automatically
an area identification process that identifies plural areas within a predetermined frequency range for which the measured frequency-amplitude characteristics deviate from target characteristics,
an area selection process that selects a largest area from the plural areas for which an equalizing means has not been applied as a next area for applying the at least one equalizing means,
a center frequency determination process for identifying for each of the at least one equalizing means the selected center frequency from a limited set of predetermined frequencies based on a comparison of the measured or computed frequency-amplitude characteristics with the target characteristics,
a gain value determination process for identifying for each of the at least one equalizing means the selected gain value based on a difference between the measured or computed frequency-amplitude characteristics and the target characteristics at the selected center frequency, and
a Q value determination process for identifying for each of the at least one equalization means the selected Q value from a finite set of predetermined candidate Q values, the selected Q value identified based on a comparison of computed frequency-amplitude characteristics with the target characteristics.

16. A signal processing apparatus comprising:
a plurality of equalizing means, each of the equalizing means configured for setting a selected gain value at a selected center frequency, and a selected degree of sharpness (selected Q value) and modifying an input signal using the selected center frequency, the selected gain value, and the selected Q value; and
computation means,
wherein the computation means performs automatically
an area identification process that identifies plural areas within a predetermined frequency range for which measured frequency-amplitude characteristics deviate from target characteristics,
an area selection process that selects a largest area from the plural areas for which an equalizing means has not been applied as a next area for applying the at least one equalizing means,
and for each of the equalizing means,
a center frequency determination process for identifying the selected center frequency from a limited set of predetermined frequencies based on a comparison of the measured or computed frequency-amplitude characteristics with the target characteristics, the selected center frequency corresponding to a fixed frequency point nearest a frequency point at which a gain difference from the target characteristics is largest in a specified area,
an equalizing means selection process for selecting the equalizing means at the selected center frequency from among the plurality of equalizing means,
a gain value determination process for identifying the selected gain value based on a difference between the measured or computed frequency-amplitude characteristics and the target characteristics at the selected center frequency, and
a Q value determination process for identifying the selected Q value from a finite set of predetermined candidate Q values, the selected Q value identified based on a comparison of computed frequency-amplitude characteristics with the target characteristics.

17. A signal processing apparatus comprising:
at least one equalizing section, each of the equalizing sections configured for setting a selected center frequency, a selected gain value at the selected center frequency, and a selected degree of sharpness (selected Q value) and modifying an input signal using the selected center frequency, the selected gain value, and the selected Q value; and
a computation section,
wherein the computation section performs automatically
an area identification process that identifies plural areas within a predetermined frequency range for which measured frequency-amplitude characteristics deviate from target characteristics, an area selection process that selects a largest area from the plural areas for which an equalizing section has not been applied as a next area for applying the at least one equalizing sections, a center frequency determination process for identifying for each of the at least one equalizing means the selected center frequency from a limited set of predetermined frequencies based on a comparison of the measured or computed frequency-amplitude characteristics with the target characteristics, a gain value determination process for identifying for each of the at least one equalizing means the selected gain value based on a difference between the measured or computed frequency-amplitude characteristics and the target characteristics at the selected center frequency, and a Q value determination process for identifying for each of the at least one equalization means the selected Q value from a finite set of predetermined candidate Q values, the selected Q value identified based on a comparison of computed frequency-amplitude characteristics with the target characteristics.

18. A sound field correction system comprising:
a speaker;
a microphone; and
a signal processing apparatus,
wherein the signal processing apparatus comprises
a measurement section configured to measure frequency-amplitude characteristics on the basis of a result in which a test signal output from the speaker is detected by the microphone, at least one equalizing section, each of the equalizing sections configured for setting a selected center frequency, a selected gain value at the selected center frequency, and a selected degree of sharpness (selected Q value) and modifying an input signal using the selected center frequency, the selected gain value, and the selected Q value, and a computation section, wherein the computation section performs automatically an area identification process that identifies plural areas within a predetermined frequency range for which the measured frequency-amplitude characteristics deviate from target characteristics, an area selection process that selects a largest area from the plural areas for which an equalizing section has not been applied as a next area for applying the at least one equalizing section, a center frequency determination process for identifying for each of the at least one equalizing means the selected center frequency from a limited set of predetermined frequencies based on a comparison of measured or computed frequency-amplitude characteristics with target characteristics, a gain value determination process for identifying for each of the at least one equalizing means the selected gain value based on a difference between the measured or computed frequency-amplitude characteristics and the target characteristics at the selected center frequency, and a Q value determination process for identifying for each of the at least one equalization means the selected Q value from a finite set of predetermined candidate Q values, the selected Q value identified based on a comparison of computed frequency-amplitude characteristics with the target characteristics.

19. A signal processing apparatus comprising:
a plurality of equalizing sections, each of the equalizing sections configured for setting a selected gain value at a selected center frequency, and a selected degree of sharpness (selected Q value) and modifying an input signal using the selected center frequency, the selected gain value, and the selected Q value; and
a computation section,
wherein the computation section performs automatically
an area identification process that identifies plural areas within a predetermined frequency range for which the measured frequency-amplitude characteristics deviate from target characteristics, an area selection process that selects a largest area from the plural areas for which an equalizing section has not been applied as a next area for applying the at least one equalizing sections, and for each of the equalizing sections, a center frequency determination process for identifying the selected center frequency from a limited set of predetermined frequencies based on a comparison of measured or computed frequency-amplitude characteristics with target characteristics, the selected center frequency corresponding to a fixed frequency point nearest a frequency point at which a gain difference from the target characteristics is largest in a specified area, an equalizing section selection process for selecting the equalizing section at the selected center frequency from among the plurality of equalizing sections, a gain value determination process for identifying the selected gain value based on a difference between the measured or computed frequency-amplitude characteristics and the target characteristics at the selected center frequency, and a Q value determination process for identifying the selected Q value from a finite set of predetermined candidate Q values, the selected Q value identified based on a comparison of computed frequency-amplitude characteristics with the target characteristics.

* * * * *